(12) United States Patent
Kim et al.

(10) Patent No.: US 8,502,478 B2
(45) Date of Patent: Aug. 6, 2013

(54) VARIABLE GATE FIELD-EFFECT TRANSISTOR AND ELECTRICAL AND ELECTRONIC APPARATUS INCLUDING THE SAME

(75) Inventors: Hyun Tak Kim, Daejeon (KR); Bong Jun Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 261 days.

(21) Appl. No.: 13/089,244

(22) Filed: Apr. 18, 2011

(65) Prior Publication Data

US 2011/0254613 A1 Oct. 20, 2011

(30) Foreign Application Priority Data

Apr. 19, 2010 (KR) .................. 10-2010-0035892
Mar. 4, 2011 (KR) .................. 10-2011-0019643

(51) Int. Cl.
*H05B 37/02* (2006.01)
*H01L 21/8222* (2006.01)
*H01L 35/00* (2006.01)

(52) U.S. Cl.
USPC ........... 315/309; 327/512; 327/513; 327/540; 438/238; 438/328; 438/330; 257/133; 257/140; 257/195; 257/252; 257/E21.608; 257/E21.616; 257/E27.016

(58) Field of Classification Search
USPC ........... 315/309; 327/512, 513, 540; 438/238, 438/328, 330; 257/133, 140, 195, 252, E21.608, 257/E21.616, E27.016
See application file for complete search history.

(56) References Cited

U.S. PATENT DOCUMENTS

| | | | | |
|---|---|---|---|---|
| 5,793,691 A | * | 8/1998 | Mullarkey | 365/211 |
| 6,087,888 A | * | 7/2000 | Inokuchi | 327/513 |
| 2008/0247253 A1 | * | 10/2008 | Nguyen et al. | 365/211 |
| 2011/0018607 A1 | * | 1/2011 | Kim et al. | 327/478 |
| 2011/0043141 A1 | * | 2/2011 | Kim et al. | 315/309 |

FOREIGN PATENT DOCUMENTS

| | | |
|---|---|---|
| JP | 8-88547 A | 4/1996 |
| JP | 2002-222953 A | 8/2002 |
| WO | WO 2009/064098 A2 | 5/2009 |

* cited by examiner

*Primary Examiner* — Dao H Nguyen
(74) *Attorney, Agent, or Firm* — Rabin & Berdo, P.C.

(57) ABSTRACT

Provided are a variable field effect transistor (FET) designed to suppress a reduction of current between a source and a drain due to heat while decreasing a temperature of the FET, and an electrical and electronic apparatus including the variable gate FET. The variable gate FET includes a FET and a gate control device that is attached to a surface or a heat-generating portion of the FET and is connected to a gate terminal of the FET so as to vary a voltage of the gate terminal. A channel current between the source and drain is controlled by the gate control device that varies the voltage of the gate terminal when the temperature of the FET increases above a predetermined temperature.

20 Claims, 13 Drawing Sheets

VARIABLE GATE FIELD-EFFECT TRANSISTOR AND ELECTRICAL AND ELECTRONIC APPARATUS INCLUDING THE SAME

CROSS-REFERENCE TO RELATED PATENT APPLICATION

This application claims the benefit of Korean Patent Application No. 10-2010-0035892, filed on Apr. 19, 2010, in the Korean Intellectual Property Office, the disclosure of which is incorporated herein in its entirety by reference.

BACKGROUND OF THE INVENTION

1. Field of the Invention

The present invention relates to a field effect transistor (FET), and more particularly, to a high efficiency, low emission FET that can operate stably by varying a gate voltage of the FET by using a Metal-Insulator Transition (MIT) device or thermistor.

2. Description of the Related Art

Electronic components such as transistors are three-terminal devices and representatively act as a switch. Transistors are classified into bipolar transistors consisting of pn junctions and FETs that are used as capacitors. FETs designed for high-speed signal amplification have been generally used as DC-to-DC converters, DC switching devices, and radio frequency (RF) signal amplifiers in the front-end of an electrical and electronic apparatus. However, FETs have a major problem in that heat generated in a conducting layer between a source and a drain is transferred to a gate insulator, thus causing a reduction of channel current between the source and the drain.

Due to the above problem, it may be difficult to amplify signals at high speed in a FET. Thus, in order to achieve high speed amplification in FETs, there is a need for peripheral devices such as a temperature sensor, a memory, and a digital-to-analog (D-A) converter, a microprocessor for controlling the peripheral devices, and a complex system programmed to operate the peripheral devices.

SUMMARY OF THE INVENTION

The present invention provides a variable gate field effect transistor (FET) designed to suppress current reduction between a source and a drain due to heat while decreasing a temperature of the FET and an electrical and electronic apparatus including the variable gate FET.

According to an aspect of the present invention, there is provided a variable gate FET including a FET and a gate control device that is attached to a surface or a heat-generating portion of the FET and is connected to a gate terminal of the FET so as to vary a voltage of the gate terminal. A channel current between a source and a drain is controlled by the gate control device that varies the voltage of the gate terminal when a temperature of FET increases above a predetermined temperature.

The gate control device may include a Metal-Insulator Transition (MIT) device inducing an abrupt MIT at a critical temperature. The MIT device may include a MIT film in which an abrupt MIT is induced at the critical temperature and two electrode films contacting the MIT film. A first electrode film that is one of the two electrode films may be connected to the gate terminal while a second electrode film that is the other of the two electrode films may be connected to a control voltage source or ground.

The FET has a drain electrode connected to a driving voltage source, a source electrode connected to a driving device, and a gate connected in common to a gate voltage source and the MIT device.

The gate control device may include a thermistor whose resistance decreases with an increase in temperature. The thermistor has two terminals, one of which is connected to the gate of the FET and the other terminal is connected to a control voltage source or ground.

The FET and the gate control device may be packaged into one chip. The variable gate FET may further include a heat transfer medium transferring heat generated in the FET. Alternatively, the FET and the gate control device may be packaged separately and assembled together so as to transfer heat through the heat transfer medium.

According to another aspect of the present invention, there is provided an electrical and electronic apparatus including a driving device and at least one variable gate FET described above, which controls current that is supplied to the driving device. The gate control device may include a MIT device inducing an abrupt MIT at a critical temperature or a thermistor whose resistance decreases with an increase in temperature. One terminal of the MIT device or the thermistor may be connected to the gate of the FET while the other terminal thereof may be connected to a control voltage source or ground.

The electrical and electronic apparatus may include a plurality of variable gate FETs that are arranged in an array to form a FET array device, each of which is connected to the gate control device.

The electrical and electronic apparatus may include at least one of a radio frequency (RF) signal amplifier, a DC-to-DC (DC-DC) switching device, a switching device for power supply, a switching device for high-speed signal processing in a microprocessor, a light emitting device (LED) control switching device, switching devices for controlling the power of electronic appliances and apparatuses, charging a lithium (Li) ion battery, controlling pixels in a display, controlling memory cells, and amplifying acoustic and audio signals in an acoustic apparatus, a photo relay, and an optical switch, in which the variable gate FET is used.

A variable gate FET and an electrical and electronic apparatus including the variable gate FET according to embodiments of the present invention are designed to vary a voltage that is applied to a gate of a FET depending on the amount of heat generated in the FET using a MIT device or thermistor. Thus, current between source and drain of a FET can be increased but the temperature of the FET can be decreased, thereby providing stable operation of the FET.

Accordingly, as a high-speed, high-power, low-emission switching element, the variable gate FET according to an embodiment of the present invention can be used in switching devices such as a RF signal amplifier, a DC-DC switching device, a switching device for power supply, a switching device for high-speed signal processing in a microprocessor, a LED control switching device, switching devices for controlling the power of electronic appliances and apparatuses, charging a Li ion battery, controlling pixels in a display, controlling memory cells, and amplifying acoustic and audio signals in an acoustic apparatus, a photo relay, and an optical switch. Furthermore, the variable gate FET can be usefully employed for a wide variety of electrical and electronic apparatus including the variable gate FET, such as mobile phones, notebook and other computers, and memories.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
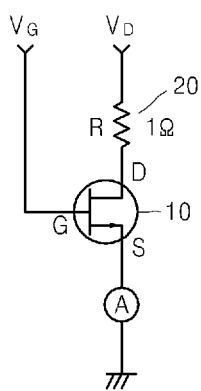
FIG. 1 is a basic circuit diagram for explaining the operation of an N-type field effect transistor (FET)

The present invention will now be described more fully with reference to the accompanying drawings, in which exemplary embodiments of the invention are shown. It will be understood that when an element is referred to as being "on" another element, it can be directly on the other element, or intervening elements may also be present. In the drawings, thicknesses and dimensions of elements are exaggerated for convenience of explanation and clarity, and portions of elements not related to the description are omitted. Like reference numerals refer to like elements throughout this description and the drawings. Although specific terms are employed herein, they are used for describing exemplary embodiments of the present invention and are not intended to limit the scope of the invention as set forth in the claims. In the description of the present invention, when some explanations of known functions or configurations are deemed to unnecessarily obscure the essence of the present invention, the detailed descriptions thereof may be omitted.

FIG. 1 is a basic circuit diagram for explaining the operation of an N-type field effect transistor (FET). Referring to FIG. 1, a FET 10 is generally a three-terminal switch. The FET 10 turns on/off a channel between a source S and a drain D by adjusting a voltage that is applied from a gate voltage source $V_G$ to a gate G and supplies current from a driving voltage source $V_D$ to a driving device (not shown). While FETs can be classified into N-type FETs and P-type FETs, the FET 10 is an N-type FET.

In the FET 10, charge carriers induced by a gate voltage flow due to application of a source-drain voltage and thus current is supplied to the driving device. The FET 10 may be used as a power FET by increasing the source-drain voltage so that a large current can flow. Furthermore, the FET 10 may act as a high-speed switching device that performs high-speed switching by applying an appropriate gate voltage when the source-drain voltage is low.

However, in the FET 10, heat is generated in a source-drain channel layer during high-speed switching and is then transferred to a gate insulator, thereby causing a reduction of channel current between the source S and the drain D. A reduction in the channel current may cause the driving device to malfunction. In this case, (A) denotes a current meter that is connected to the FET 10 instead of the driving device.

Figure 2:
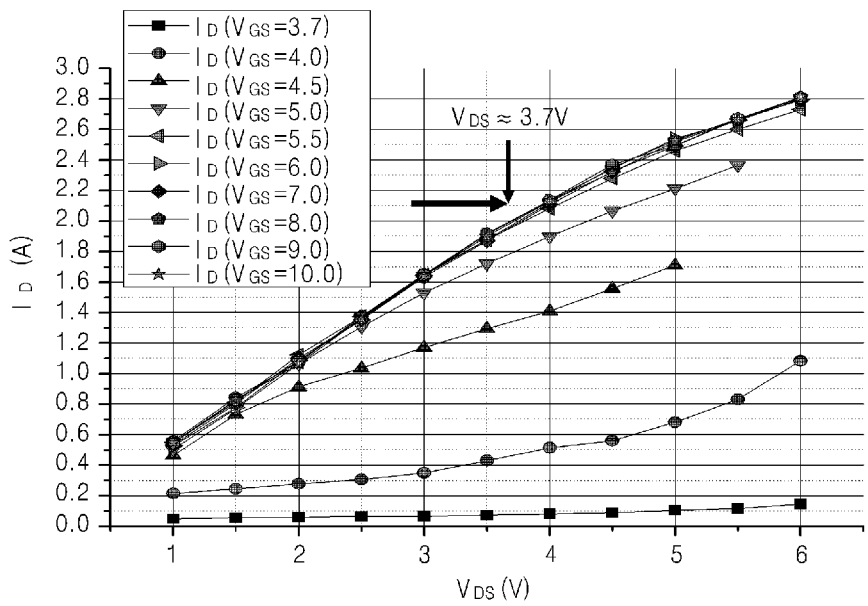
FIG. 2 is a graph of drain current $I_D$ against source-drain voltage $V_{DS}$ for different values of gate voltage $V_{GS}$ in the circuit of FIG. 1.

FIG. 2 is a graph of drain current $I_D$ against source-drain voltage $V_{DS}$ for different values of gate voltage $V_{GS}$ in the circuit of FIG. 1 when an N-MOS IRF640 FET is used as the FET 10. Referring to FIG. 2, the drain current $I_D$ increases as the source-drain voltage $V_{DS}$ increases. The rate at which the drain current $I_D$ is increased, i.e., the slope of the graph, also increases with an increase in the gate voltage $V_{GS}$. However, at gate voltages $V_{GS}$ above 5.5 V, the drain current $I_D$ increases only slightly despite an increase in the gate voltage $V_{GS}$. A point on the graph at which the drain current $I_D$ is 2 A when the source-drain voltage $V_{DS}$ is about 3.7 V is indicated by an arrow.

Figure 3:
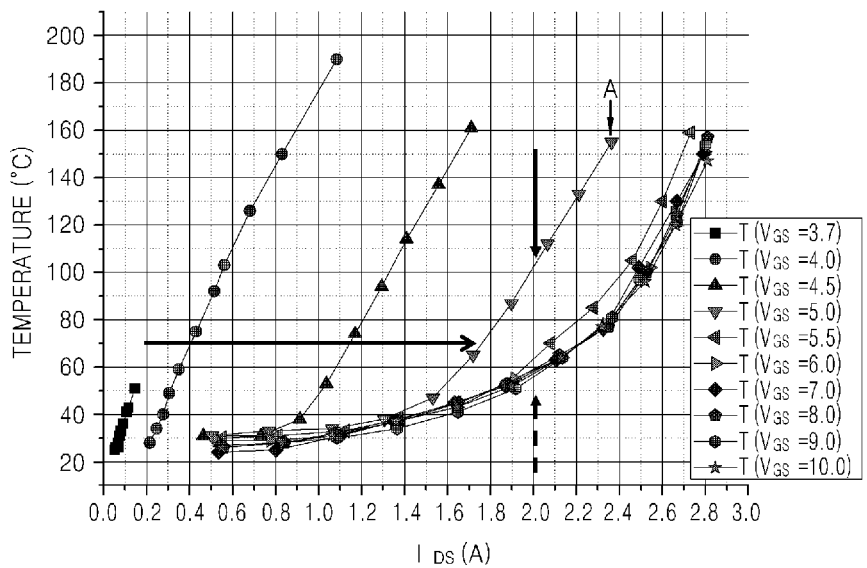
FIG. 3 is a graph of surface temperature of the FET in the circuit of FIG. 1 against source-drain current $I_{DS}$ for different values of gate voltage $V_{GS}$.

FIG. 3 is a graph of surface temperature T of the FET in the circuit of FIG. 1 against source-drain current $I_{DS}$ for different values of gate voltage $V_{GS}$ when an N-MOS IRF640 FET is used as the FET 10. In this case, the source-drain current $I_{DS}$ is deemed the same as the drain current $I_D$ shown in FIG. 2. Referring to FIG. 3, the surface temperature T of the FET increases as the source-drain current $I_{DS}$ increases. It can also be seen that as the gate voltage $V_{GS}$ increases, the temperature-current curve moves toward the right side. This means that the surface temperature of the FET 10 can be lowered by increasing the gate voltage $V_{GS}$. As can be seen from a bold black arrow drawn along the X-axis at a temperature of 70° C. on the Y-axis, the surface temperature T of the FET 10 remains constant despite an increase in the source-drain current $I_{DS}$ due to the application of the increased gate voltage $V_{GS}$.

For example, curve A at a gate voltage $V_{GS}$ of 5.0 V shows the surface temperature of the FET 10 to be above 100° C. when the source-drain current $I_{DS}$ is about 2.0 A. However, when the gate voltage $V_{GS}$ is further increased above 5.5 V, the surface temperature of the FET 10 decreases to about 60° C. at a source-drain current of 2.0 A. Like in the graph of FIG. 2, in which the increasing rate of the drain current $I_D$ no longer increases despite a further increase in the gate voltage $V_{GS}$ above 5.5 V, the temperature-current curve remains almost stationary without moving further to the right at a gate voltage $V_{GS}$ above 5.5 V.

Thus, referring to FIG. 3, by increasing a voltage that is applied to a gate electrode of the FET 10, the source-drain current $I_{DS}$ can be increased while decreasing the surface temperature of the FET.

Figure 4:
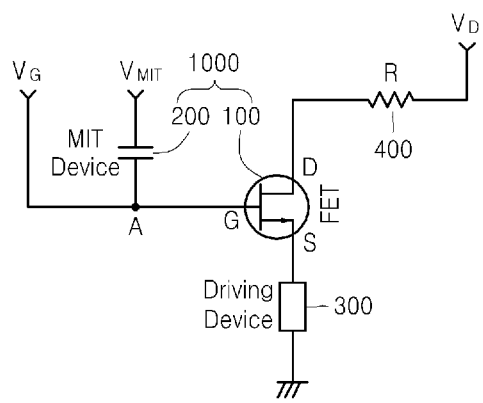
FIG. 4 is a circuit diagram of an electrical and electronic apparatus including a variable gate FET according to an embodiment of the present invention.

FIG. 4 is a circuit diagram of an electrical and electronic apparatus including a variable gate FET according to an embodiment of the present invention. Referring to FIG. 4, the electrical and electronic apparatus may include a variable gate FET 1000 and a driving device 300. The variable gate FET 1000 includes a FET 100 and a Metal-Insulator Transition (MIT) device 200 connected to a gate G of the FET 100.

The FET 100 has a drain D connected to a driving voltage source $V_D$ and a source S connected to the driving device 300. Furthermore, a gate voltage source $V_G$ and the MIT device 200 may be connected together to the gate G of the FET 100 through a junction A. The MIT device 200 has two terminals, one of which is connected to the gate G of the FET 100 and the other is connected to a control voltage source $V_{MIT}$.

The electrical and electronic apparatus may further include a resistor 400 that is disposed between the drain D and the driving voltage source $V_D$ and drops a voltage therebetween and protects the FET 100. Although not shown in FIG. 4, resistors may be connected between the gate voltage source $V_G$ and the gate G and between the control voltage source $V_{MIT}$ and the other terminal of the MIT device 200. Furthermore, other resistors may be added at the required portions of the electrical and electronic apparatus or may be omitted if they are not required.

The MIT device 200 is a two-terminal device that acts as an insulator at a temperature below a critical temperature and abruptly transits into metal at a temperature that is equal to or greater than the critical temperature. The structure and characteristics of the MIT device 200 will be described below in more detail with reference to FIGS. 6A through 6C and FIG. 7.

The operation of the variable FET 1000 in the electrical and electronic apparatus according to the present embodiment will now be described. As described above, heat generated after high speed switching may accumulate and cause a decrease in channel current between the source S and the drain D. However, in this case, the heat is then transferred to the MIT device 200 so that the MIT device 200 transits into metal. Thus, a voltage at the control voltage source $V_{MIT}$ is applied to the gate G of the FET 100 via the junction A so that the gate voltage of the FET 100 increases. When the gate voltage of the FET 100 increases, as shown in the graph of FIG. 3, the source-drain current will increase. That is, the current reduction caused by heat generation is compensated for by an increase in current due to the gate voltage increase, so that there will be no substantial decrease in the current applied to the driving device 300. Therefore, the driving device 300 can operate stably. Furthermore, with the increase in the source-drain current, the temperature of a source-drain channel layer will decrease. As indicated above by the bold black arrow drawn at 70° C. on the Y-axis, this is because the temperature remains almost constant in spite of an increase in the source-drain current due to the application of increased gate voltage.

Table 1 shows the results of experimental measurement in a circuit designed as shown in FIG. 4 when an IRF 640 FET is used as the FET 100, the resistor 400 has a resistance of 5Ω, and heat is applied to the MIT device 200 by using a heat gun.

TABLE 1

| $V_G$ | $V_D$ | $I_{DS}$ | $V_{MIT}$ | Temp. | |
|---|---|---|---|---|---|
| 4 V | 7 V | 0.6 A | 5 V<br>ΔV = 1 V<br>(Voltage between<br>$V_{MIT}$ and<br>junction A) | 136° C. | Before applying heat to MIT device |
| 4.7 V | 7 V | 1.0 A | | 70° C. | After applying heat to MIT device |

In Table 1, $V_G$ and $V_D$ represent a gate voltage and a drain voltage that are applied to the FET 100, respectively. $I_{DS}$ and $W_{MIT}$ denote a source-drain current and a voltage from a control voltage source connected to the MIT device 200, respectively, and Temp. denotes a surface temperature of the FET 100.

As seen from Table 1, the surface temperature of the FET 100 is 136° C. and the source-drain current $I_{DS}$ 0.6 A before heat is applied to the MIT device 200. However, after heat is applied to the MIT device 200, it can be observed that the gate voltage of the FET 100 has increased from 4 V to 4.7 V and the source-drain current has increased from 0.6 A to 1.0 A while the surface temperature of the FET 100 has decreased from 136° C. to 70° C. These results are absolutely consistent with the operation principle of the FET 1000.

Considering the operation principle of the variable gate FET 1000, the MIT device 200 may be attached to a surface of the FET 100 or a heat generating portion of the FET 100. For example, the MIT device 200 may be attached to a portion of the FET 100 in close proximity to a channel layer or a gate electrode of the FET 100 so as to effectively deliver the generated heat.

Figure 5:
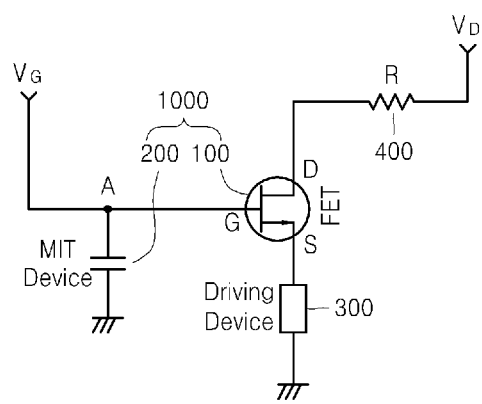
FIG. 5 is a circuit diagram of an electrical and electronic apparatus including a variable gate FET according to another embodiment of the present invention.

FIG. 5 is a circuit diagram of an electrical and electronic apparatus including a variable gate FET according to another embodiment of the present invention. Referring to FIG. 5, the electrical and electronic apparatus according to the present embodiment has a similar structure to the electrical and electronic apparatus of FIG. 4 except for the position of the MIT device 200. That is, one terminal of the MIT device 200 is connected to a gate G of a FET 100 via a junction A while the other terminal thereof is connected to ground instead of a control voltage source.

By connecting the MIT device 200 to ground, the source-drain current of the FET 100 can be reduced. For example, if the source-drain current has to be reduced after having been increased in the structure shown in FIG. 4, the source-drain current can be reduced by connecting the MIT device 200 to ground.

Although the variable gate FETs according to the above embodiments of the present invention have been described having one FET and one MIT device connected thereto, they are not limited thereto, and may have various other structures. For example, a variable gate FET according to an embodiment of the present invention may have a FET array device including a plurality of FETs arranged in an array, each of which is connected to one MIT device.

Figure 6A:
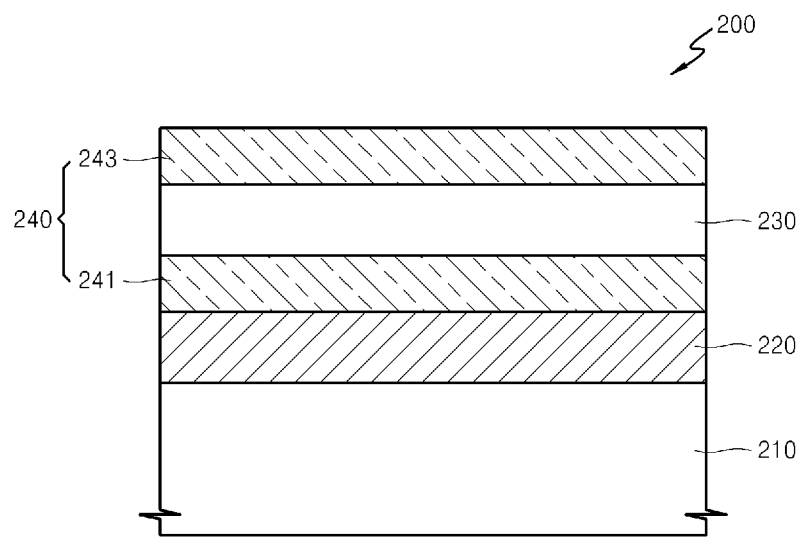
FIGS. 6A and 6B are cross-sectional views of Metal-Insulator Transition (MIT) devices that can be used in the variable gate FET of FIG. 4 or 5.
Figure 6B:
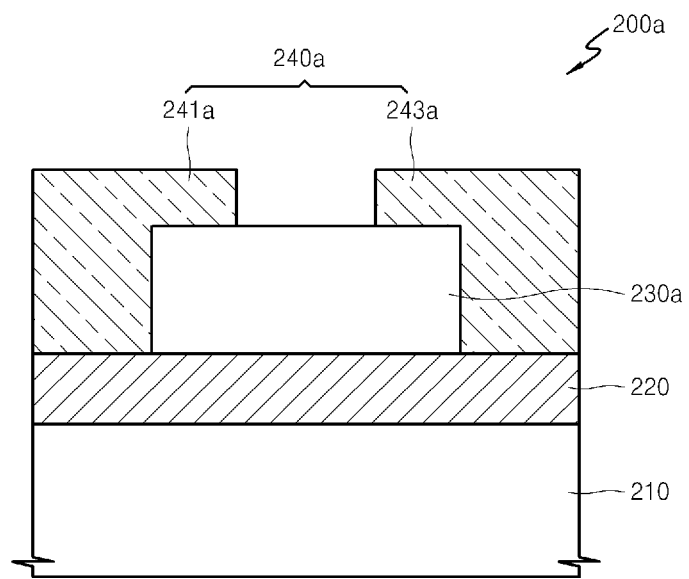

FIGS. 6A and 6B are cross-sectional views of MIT devices that can be used in the variable gate FET of FIG. 4 or 5. FIG.

Figure 6C:
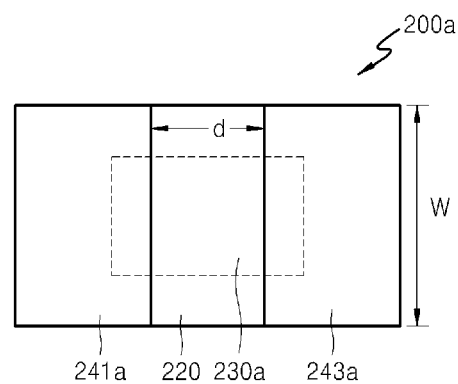
FIG. 6C is a plan view of the MIT device of FIG. 6B.

6A is a cross-sectional view of a MIT device 200 having a stack structure while FIG. 6B is a cross-sectional view of a MIT device 200a having a horizontal structure. FIG. 6C is a plan view of the MIT device 200a of FIG. 6B.

Referring to FIG. 6A, the stack-type MIT device 200 includes a substrate 210, a buffer layer 220, a transition film 230, and an electrode film 240 consisting of a first electrode film 241 underlying the transition film 230 and a second electrode film 243 overlying the transition film 230.

The substrate 210 may include at least one of silicon (Si), silicon dioxide ($SiO_2$), gallium arsenide (GaAs), aluminum oxide ($Al_2O_3$), plastic, glass, vanadium pentoxide ($V_2O_5$), praseodymium barium copper oxide ($PrBa_2Cu_3O_7$), yttrium barium copper oxide ($YBa_2Cu_3O_7$), magnesium oxide (MgO), strontium titanate oxide ($SrTiO_3$), niobium (Nb)-doped $SrTiO_3$, and silicon on insulator (SOI). The buffer layer 220 is formed on the substrate 210 and reduces a lattice mismatch between the substrate 210 and the first electrode film 241. If the lattice mismatch is very small, the buffer layer 220 may be omitted. The buffer layer 220 may include $SiO_2$ or silicon nitride ($Si_3N_4$).

The first electrode film 241 is formed on the buffer layer 220. In the absence of the buffer layer 220, the first electrode film 241 can be formed directly on the substrate 210. The electrode film 220 may include at least one of tungsten (W), molybdenum (Mo), chromium (Cr)/gold (Au), W/Au, Mo/Au, Ti/W, Ti/Al/N, nickel (Ni)/Cr, Al/Au, platinum (Pt), Cr/Mo/Au, $YBa_2Cu_3O_{7-d}$, Ni/Au, Ni/Mo, Ni/Mo/Au, Ni/Mo/Ag, Ni/Mo/Al, Ni/W, Ni/W/Au, Ni/W/Ag, and Ni/W/Al. The electrode film 240 may be formed using at least one of sputtering deposition, vacuum deposition, and electron-beam (E-beam) deposition.

The transition film 230 is formed on the first electrode film 241. The transition film may include at least one of an inorganic compound semiconductor or insulator material to which low-concentration holes are added, an organic semiconductor or insulator material to which low-concentration holes are added, a semiconductor material to which low-concentration holes are added, and an oxide semiconductor or insulator material to which low-concentration holes are added. The inorganic compound semiconductor or insulator material, the organic semiconductor or insulator material, the semiconductor material, and the oxide semiconductor or insulator material may include at least one of oxygen, carbon, a group III-V semiconductor element, a group II-VI semiconductor element, a transition metal element, a rare earth element, and a lanthanide element. The hole concentration is $3 \times 10^{16}$ cm$^{-3}$. Alternatively, the transition film 230 may include an n-type semiconductor or insulator material having high resistance.

The MIT device 200 undergoes an abrupt change in terms of electrical characteristics according to a change in various physical characteristics such as voltage, temperature, and electromagnetic waves. For example, the MIT device 200 may have characteristics of an insulator below a critical temperature. At or above the critical temperature, the MIT device 200 may undergo an abrupt MIT and have characteristics of a metal.

Referring to FIG. 6B, similar to the stack-type MIT device 200, the horizontal-type MIT device 200a includes a substrate 210, a buffer layer 220, a transition film 230a, and an electrode film 240a. The transition film 230a is formed on the buffer layer 220. If the lattice mismatch with the substrate 210 is very small, the transition film 230a can be formed directly on the substrate 210. Furthermore, first and second electrode films 241a and 243a of the electrode film 240a overlie the substrate 210 and are disposed on either side of the transition film 230a so as to face each other. As shown in FIG. 6B, the first and second electrode films 241a and 243a may be formed so as to cover a portion of a top surface of the transition film 230a.

The substrate 210, the buffer layer 220, the transition film 230a, and the electrode film 240a are formed of the same materials as their counterparts described with reference to FIG. 6A.

Referring to FIG. 6C, in the horizontal-type MIT device 200a, the first and second electrode films 241a and 243a each have a first width W, and they are spaced a first distance d apart from each other.

The stack- and horizontal-type MIT devices 200 and 200a may have small dimensions on the order of micrometers and can be fabricated at very low cost. Furthermore, the MIT devices 200 and 200a are able to change their critical temperature according to a structural change such as a change in the first distance d or the first width W shown in FIG. 6C.

Figure 7:
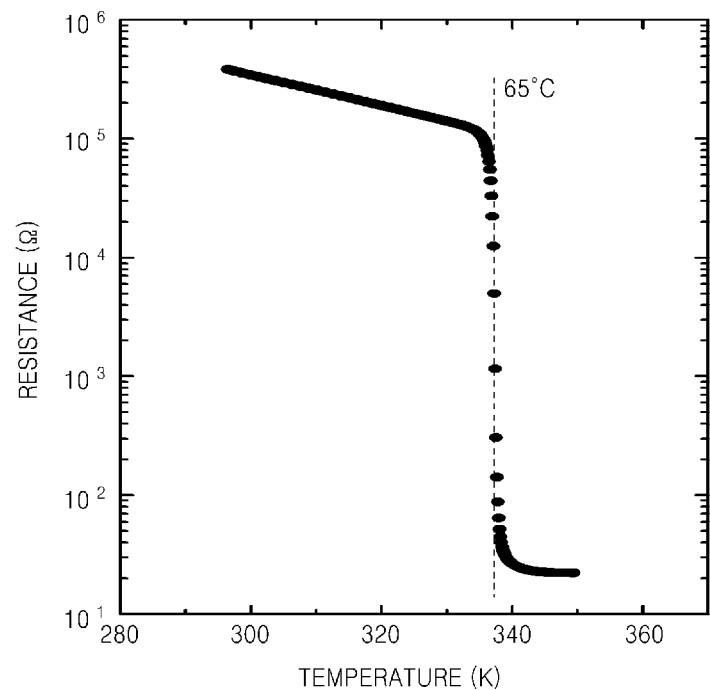
FIG. 7 is a graph of resistance against temperature of a MIT device formed of vanadium oxide ($VO_2$)

FIG. 7 is a graph of resistance against temperature of a MIT device formed of vanadium oxide ($VO_2$) when a predetermined voltage is applied to the MIT device. Referring to FIG. 7, the MIT device exhibits characteristics of an insulator having a resistance greater than $10^5$ ohms at a temperature below 340 K. On the other hand, the MIT device shows characteristics of a metal having a resistance of several tens of ohms due to an abrupt discontinuous transition at a temperature above 340 K. Thus, since the MIT device undergoes a discontinuous MIT at a temperature of 340 K, it can be seen from the graph that the critical temperature of the MIT device is about 340 K Although not shown in the drawings, it can be seen from a voltage-current graph of the MIT device that current rapidly increases at the critical temperature due to a discontinuous jump while the voltage decreases. In general, the MIT may occur due to various other physical characteristics other than temperature, such as pressure, voltage, an electromagnetic field, and electromagnetic waves. However, since these physical characteristics are not directly related to the essence of the present invention, detailed descriptions of MITs that can be induced due to the physical characteristics are omitted.

Although the MIT device used in the present experiment is formed using a MIT thin film formed of $VO_2$, it may be formed using a MIT thin film formed of a new material or other materials having discontinuous jump characteristics due to various physical characteristics. The MIT thin film may also be formed as a ceramic thin film or a single crystalline thin film.

Figure 8:
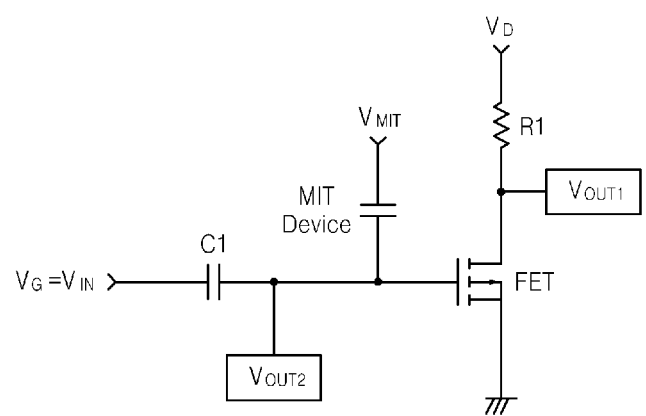
FIG. 8 is a modified circuit diagram of FIG. 4 used to measure a change in an output voltage with respect to an input sine wave.

FIG. 8 is a modified circuit diagram of FIG. 4 that is used to measure a change in an output voltage with respect to an input sine wave. In the present experiment, an input voltage $V_{IN}$ is applied to a gate terminal $V_G$ connected to one terminal of a capacitor C1, and first and second output voltages $V_{OUT1}$ and $V_{OUT2}$ are measured at a drain terminal of a FET and the other terminal of the capacitor C1, respectively.

Referring to FIG. 8, a variable gate FET used in the present experiment has the FET with a gate connected to the capacitor C1 and forms a RC circuit. The RC circuit may have the same configuration as the circuit of FIG. 4 except for the presence of the capacitor C1. The FET may be a metal oxide semiconductor (MOS) FET (e.g., KTK919S).

In the RC circuit, after a 15-MHz high frequency sine wave is applied to the gate terminal $V_G$ as an input voltage, two output waveforms of the first output voltage $V_{OUT1}$ with respect to changes in resistance $R_{MIT}$ of the MIT device and changes in voltage $V_{MIT}$ that is applied to the MIT device are observed at the drain terminal of the FET. An output waveform of the second output voltage $V_{OUT2}$ with respect to a change in resistance $R_{MIT}$ of the MIT device is also observed at the other terminal of the capacitor C1. In this case, the RC circuit is considered to be a high-pass filter. According to Equation (1), the ratio of output voltage to input voltage increases as frequency increases.

$$\frac{Vo}{Vi} = \frac{1}{\sqrt{1 + (1/\omega RC)^2}}, (\omega = 2\pi f) \quad (1)$$

Table 2 shows a change in the first output voltage $V_{OUT1}$ with respect to a change in voltage $V_{MIT}$ that is applied to the MIT device in the RC circuit of FIG. 8.

TABLE 2

| $V_G(V) =$ 5sin2πft | $V_D$ (V) | Freq. (MHz) | C (pF) | $R_1$ (Ω) | $R_{MIT}$ (Ω) | $V_{MIT}$ (V) | $V_{OUT1}$ (mV) Max. | Min. |
|---|---|---|---|---|---|---|---|---|
| 5 | 4 | 15 | 10 | 10 k | Not applicable | Not applicable | +230 | −230 |
| 5 | 4 | 15 | 10 | 10 k | 30 | 0 | 500 | −500 |
| 5 | 4 | 15 | 10 | 10 k | 30 | 0.6 | 650 | −650 |
| 5 | 4 | 15 | 10 | 10 k | 30 | 1.0 | 700 | −650 |
| 5 | 4 | 15 | 10 | 10 k | 30 | 2.0 | 800 | −700 |
| 5 | 4 | 15 | 10 | 10 k | 30 | 4.0 | 900 | −700 |

In Table 2, $V_G$ and $V_D$ represent voltages that are applied to the gate terminal and the drain terminal of the FET, respectively. Freq., C, and $R_1$ denote the frequency of an input voltage in megahertz (MHz), the capacitance of the capacitor C1, and the resistance of resistor R1 connected to the drain terminal of the FET, respectively.

From the results in Table 2, it can be seen that after the application of voltage $V_{MIT}$, the first output voltage $V_{OUT1}$ is amplified up to 900 mV that is two to four times the first output voltage $V_{OUT1}$ of 230 mV obtained before the application of voltage $V_{MIT}$. Furthermore, when the voltage $V_{MIT}$ greater than 1 V is applied, in a positive voltage of a sine wave, offset is generated. That is, while the maximum value of the first output voltage $V_{OUT1}$ increases as the voltage $V_{MIT}$ increases, its minimum value remains constant (−700 mV) when the voltage $V_{MIT}$ is greater than or equal to 2 V.

Figure 9A:
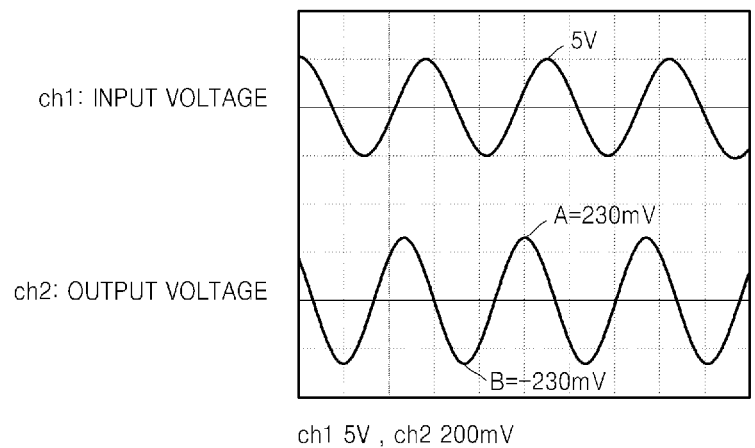
FIGS. 9A and 9B illustrate signal waveforms representing an input voltage and an output voltage measured in the circuit of FIG. 8.
Figure 9B:
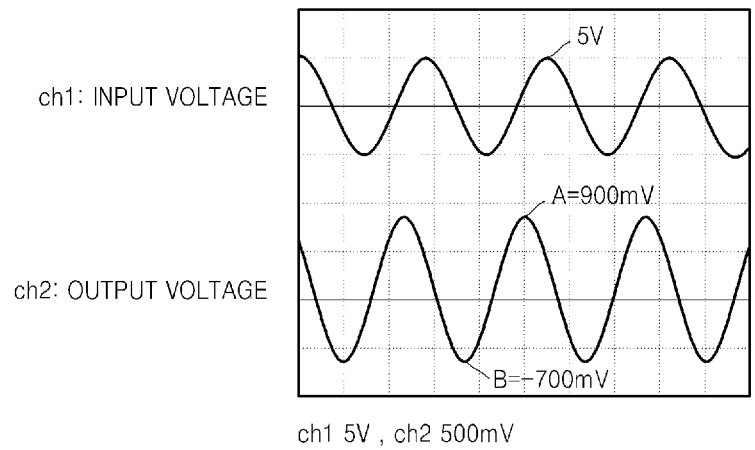

FIGS. 9A and 9B illustrate signal waveforms representing an input voltage and an output voltage measured in the circuit of FIG. 8. FIG. 9A shows a waveform of a first output voltage when the MIT device is not connected, and FIG. 9B shows a waveform of a first output voltage when a voltage of 4 V is applied to the MIT device.

The waveform shown in FIG. 9A is obtained under the conditions listed in the topmost part of Table 2 where the input voltage $V_{IN}$ is 5 sin 2πft and $R_{MIT}$ and $V_{MIT}$ are not applied. In this case, the first output voltage $V_{OUT1}$ has a very small value of 230 mV. ch1 5V at the bottom of FIG. 9A represents that a voltage scale on the input voltage waveform is 5V, and ch2 200 mV denotes that a voltage scale on the output voltage waveform is 200 mV.

The waveform shown in FIG. 9B is obtained under the conditions listed in the lowermost part of Table 2 where the input voltage $V_{IN}$ is 5 sin 2πft and $R_{MIT}$ and $V_{MIT}$ are 30Ω and 4 V, respectively. In this case, the first output voltage $V_{OUT1}$ increases up to a maximum of 900 mV and decreases to its minimum −700 mV, which induces an offset of about 200 mV. Thus, when the voltage $V_{MIT}$ is 4 V, the first output voltage $V_{OUT1}$ is amplified about four times more than when $V_{MIT}$ is not applied.

Figure 10:
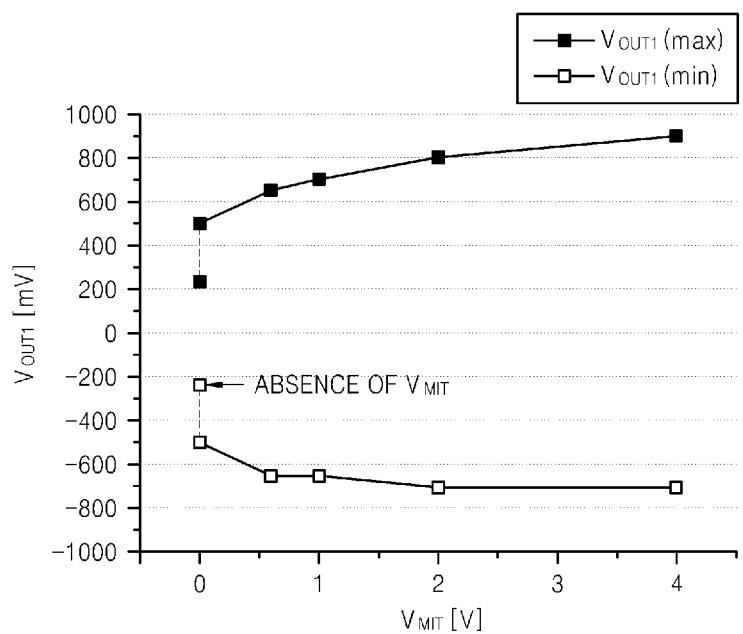
FIG. 10 is a graph of maximum and minimum output voltages with respect to a change in $V_{MIT}$, which are measured in the circuit of FIG. 8.

FIG. 10 is a graph of maximum and minimum values of the first output voltage $V_{OUT1}$ with respect to a change in $V_{MIT}$, which are measured in the circuit of FIG. 8. As evident from FIG. 10, when $V_{MIT}$ is not applied, the maximum and minimum values of the first output voltage $V_{OUT1}$ are 230 mV and −230 mV, respectively. The first output voltage $V_{OUT1}$ increases as $V_{MIT}$ increases. When $V_{MIT}$ increases, the first output voltage $V_{OUT1}$ continues to increase but its minimum value remains constant (−700 mV) when $V_{MIT}$ is greater than or equal to 2V. This continues to increase an offset induced when $V_{MIT}$ is greater than or equal to 1 V.

Table 3 shows a change in the first output voltage $V_{OUT1}$ with respect to a change in resistance $R_{MIT}$, which is measured in the circuit of FIG. 8.

TABLE 3

| $V_G(V) =$ 5sin2πft | $V_D$ (V) | Freq. (MHz) | C (pF) | $R_1$ (Ω) | $R_{MIT}$ (Ω) | $V_{MIT}$ (V) | $V_{OUT1}$ (mV) Max. | Min. |
|---|---|---|---|---|---|---|---|---|
| 5 | 4 | 15 | 10 | 5 k | 30 | 4 | 900 | −700 |
| 5 | 4 | 15 | 10 | 5 k | 10 k | 4 | 620 | −520 |
| 5 | 4 | 15 | 10 | 5 k | 50 k | 4 | 500 | −450 |
| 5 | 4 | 15 | 10 | 5 k | 100 k | 4 | 450 | −400 |

Variables in Table 3 denote the same as those described in Table 2.

From the results of Table 3, it can be seen that the first output voltage $V_{OUT1}$ decreases when the resistance $R_{MIT}$ increases. That is, amplification is difficult to achieve. When $R_{MIT}$ is 30Ω, the difference between absolute maximum and minimum values of $V_{OUT1}$ is 200 mV. That is, |900|−|−700|=200[mV]. On the other hand, when $R_{MIT}$ is 100 kΩ, the difference between absolute maximum and minimum values of $V_{OUT1}$ is 50 mV (|450|−|−400|=50[mV]). This means that the offset decreases as the resistance $R_{MIT}$ increases.

Figure 11:
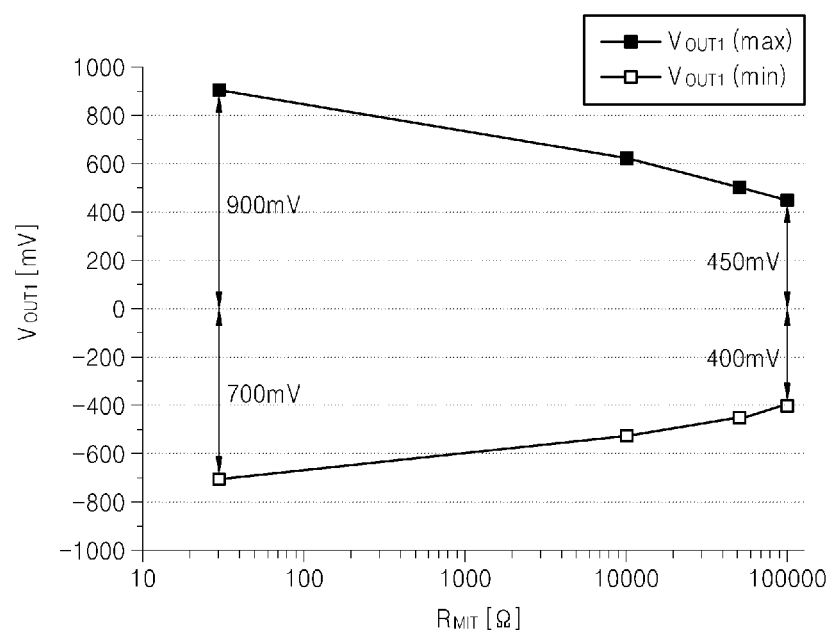
FIG. 11 is a graph of maximum and minimum output voltages with respect to a change in $R_{MIT}$, which are measured in the circuit of FIG. 8.

FIG. 11 is a graph of maximum and minimum output voltages with respect to a change in $R_{MIT}$, which are measured in the circuit of FIG. 8. Referring to FIG. 11, while the first output voltage $V_{OUT1}$ has the largest offset of 200 mV when $R_{MIT}$=30Ω, the offset of the first output voltage $V_{OUT1}$ decreases to 50 mV when $R_{MIT}$=100 kΩ. Considering the decreasing slope on the graph, the offset of the first output voltage $V_{OUT1}$ will continue to decrease until it reaches zero.

Figure 12A:
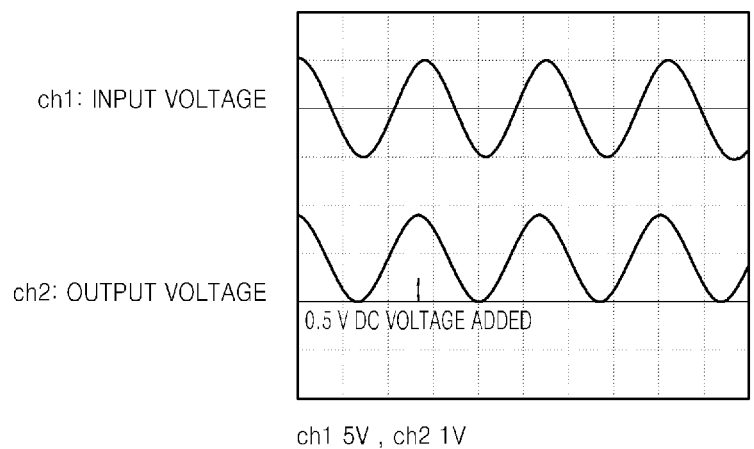
FIGS. 12A and 12B illustrate signal waveforms representing output voltages measured in the circuit of FIG. 8 after having passed through a capacitor.
Figure 12B:
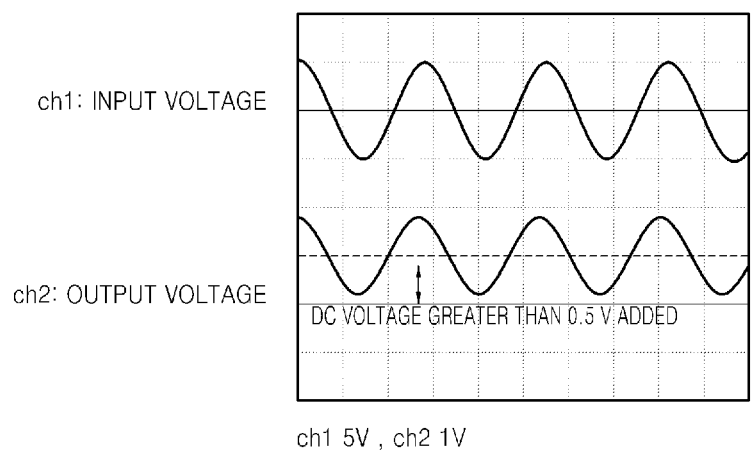

FIGS. 12A and 12B illustrate signal waveforms representing a second output voltage $V_{OUT2}$ measured in the circuit of FIG. 8 after having passed through a capacitor. The second output voltage $V_{OUT2}$ is measured under the same experimental conditions of input voltage and frequency as for the measurement of the first output voltage $V_{OUT1}$, except for the resistance $R_{MIT}$.

FIG. 12A illustrates a signal waveform of the second output voltage $V_{OUT2}$ obtained when 120Ω≦$R_{MIT}$≦200Ω. Referring to FIG. 12A, the second output voltage $V_{OUT2}$ corresponding to an output waveform obtained after having passed through a capacitor has a DC component of about 0.5V added thereto. The addition of the DC component results in an increase in base voltage. The DC component is expected to be added due to the corresponding voltage applied to the MIT device.

FIG. 12B illustrates a signal waveform of second output voltage $V_{OUT2}$ obtained when $R_{MIT}$ is less than 120Ω and is greater than 200Ω. Referring to FIG. 12A, the second output voltage $V_{OUT2}$ also has a DC component greater than 0.5V added thereto. ch1 5V at the bottom of FIG. 12B represents that a voltage scale on the input voltage waveform is 5V, and ch2 1V denotes that a voltage scale on the output voltage waveform is 1 V.

Upon comparison between the input voltage and the second output voltage $V_{OUT2}$ obtained after having passed through the capacitor as shown in FIGS. 12A and 12B, the magnitude of an output signal decreases by seven to eight times compared to that of an input signal. If addition of the DC component is not considered, the smallest offset occurs when $120\Omega \leq R_{MIT} \leq 200\Omega$. From the results of the experiment designed to measure first and second output voltages in the circuit of FIG. 8, it can be seen that by varying the voltage to the MIT device and resistance, a RC high frequency circuit produces a first output voltage higher than that obtained from a circuit simply having a resistor R and a capacitor C. In $V_{MIT}=4V$, the RC high frequency circuit delivers the maximum first output voltage of 900 mV that is about four times the first output voltage obtained when $V_{MIT}$ is not applied. Furthermore, with increasing $R_{MIT}$, the first output voltage $V_{OUT1}$ as well as an offset decreases. The smallest offset occurs when $120\Omega \leq R_{MIT} \leq 200\Omega$. In the present experiment, although a 15 MHz high frequency sine wave is used as an input voltage, a RF signal can be used as an input voltage to obtain the same results.

Figure 13:
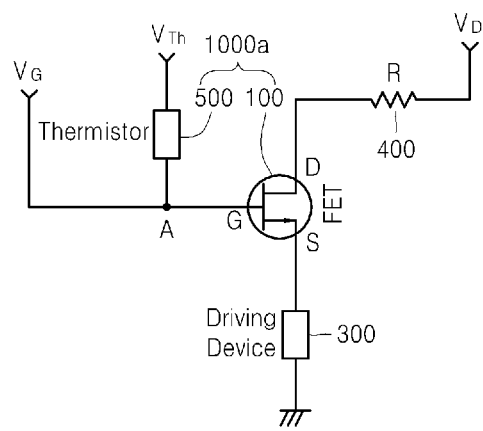
FIG. 13 is a circuit diagram of an electrical and electronic apparatus including a variable gate FET according to another embodiment of the present invention.

FIG. 13 is a circuit diagram of an electrical and electronic apparatus including a variable gate FET according to another embodiment of the present invention. Referring to FIG. 13, like the electrical and electronic apparatus of FIG. 4, the electrical and electronic apparatus according to the present embodiment includes a variable gate FET 1000a and a driving device 300. However, the variable gate FET 1000a has a different structure compared to that of the variable gate FET 1000 shown in FIG. 4. That is, the variable gate FET 1000a includes a FET 100 and a thermistor 500 connected to a gate G of the FET 100.

The thermistor 500 may perform the same function as the MIT device 200 shown in FIG. 4. Thus, the variable gate FET 1000a has the same device connection structure as the variable gate FET 1000. That is, the FET 100 has a drain D connected to a driving voltage source $V_D$ and a source S connected to the driving device 300. Furthermore, a gate voltage source $V_G$ and the thermistor 500 may be connected together to the gate G of the FET 100 through a junction A. The thermistor 500 has two terminals, one of which is connected to the gate G of the FET 100 and the other is connected to a control voltage source $V_{TH}$. The electrical and electronic apparatus may further include a resistor 400 disposed between the drain D and the driving voltage source $V_D$. Furthermore, other resistors may be added, as required, to the electrical and electronic apparatus or omitted if they are not required.

The thermistor 500 is a two- or three-terminal device whose resistance decreases with increasing temperature. The structure and characteristics of the thermistor 500 will be described below in more detail with reference to FIGS. 15A and 15B.

In the present embodiment, the variable gate FET 1000a works on similar operating principles to the variable gate FET 1000 shown in FIG. 4. More specifically, heat is generated after high speed switching, causing a decrease in channel current between the source S and the drain D. However, in this case, the heat is then transferred to the thermistor 500 so that the resistance of the thermistor 500 decreases. Thus, a voltage from the control voltage source $V_{TH}$ is applied to the gate G of the FET 100 via the junction A so as to increase the gate voltage of the FET 100. In the variable gate FET 1000 including the MIT device 200, almost the same voltage as the voltage from the control voltage source $V_{MIT}$ is applied to the gate G of the FET 100 since the MIT device 200 transits into a metal. On the other hand, in the variable gate FET 1000a including the thermistor 500, a voltage, which is obtained by subtracting a voltage corresponding to a decrease in resistance from the control voltage source $V_{TH}$, is applied to the gate G of the FET 100.

Accordingly, the source-drain current increases due to an increase in the gate voltage of the FET 100. As described above, the temperature of the source-drain channel layer also decreases with the increase in the source-drain current.

Figure 14:
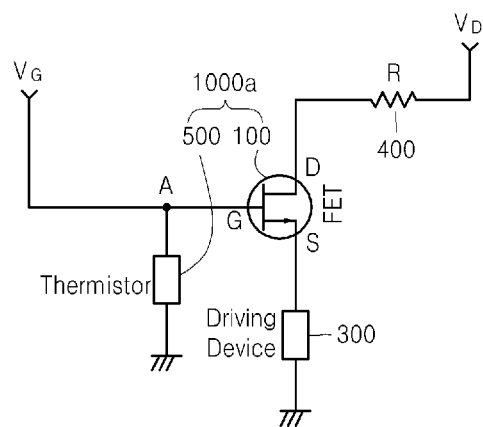
FIG. 14 is a circuit diagram of an electrical and electronic apparatus including a variable gate FET according to another embodiment of the present invention.

FIG. 14 is a circuit diagram of an electrical and electronic apparatus including a variable gate FET according to another embodiment of the present invention. Referring to FIG. 14, the electrical and electronic apparatus according to the present embodiment has the same configuration as the electrical and electronic apparatus of FIG. 13 except for the position of the thermistor 500. That is, one terminal of the thermistor 500 is connected to a gate G of a FET 100 via a junction A while the other terminal thereof is connected to ground. By connecting the thermistor 500 to ground, the source-drain current of the FET 100 can be reduced. A ground voltage is applied to the thermistor 500 for the same reason and principle as when a ground voltage is applied to the MIT device 200 in the electrical and electronic apparatus of FIG. 5. Furthermore, like the variable gate FET 1000 using the MIT device 200, the variable gate FET 1000a using the thermistor 500 may have a FET array device including a plurality of FETs arranged in an array, each of which is connected to one thermistor.

For convenience of explanation, the MIT device 200 and the thermistor 500 are hereinafter collectively referred to as a 'gate control device'.

Figure 15A:
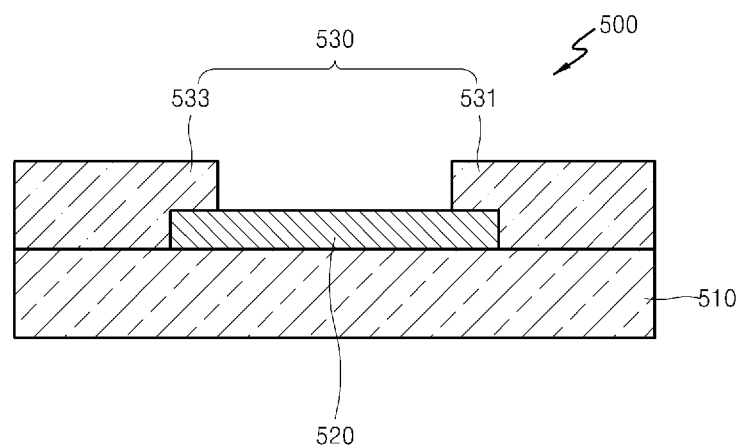
FIGS. 15A and 15B are cross-sectional views of thermistors that can be used in the variable gate FET shown in FIG. 13 or 14.
Figure 15B:
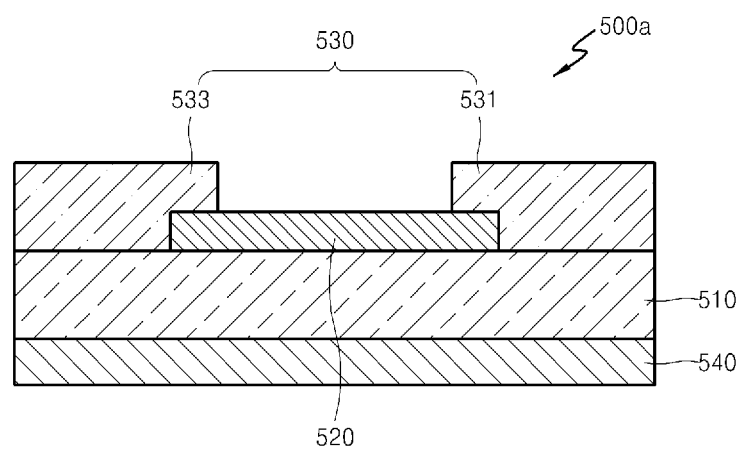

FIGS. 15A and 15B are cross-sectional views of thermistors that can be used in the variable gate FET shown in FIG. 13 or 14. FIG. 15A is a cross-sectional view of a two-terminal thermistor 500 and FIG. 15B is a cross-sectional view of a three-terminal thermistor. Referring to FIG. 15A, the two-terminal thermistor 500 includes a substrate 510, a thermistor film 520, and an electrode film 530. The substrate 510 may be an insulating substrate or a silicon semiconductor substrate.

The thermistor film 520 is formed on the substrate 510 and has a negative temperature coefficient (NTC) which will be described in more detail with reference to FIG. 16. For example, the thermistor film 520 may be formed using a semiconductor film including a group III-V compound semiconductor, a group II-VI compound semiconductor, graphene and carbon nanotubes that are carbon compounds, a pn junction diode such as Si pn junction, $V_2O_5$, p-GaAs, and p-type-germanium (p-Ge).

The thermistor film 520 is disposed between first and second electrode films 531 and 533. The thermistor film 520 may have a single rectangular band shape that is connected between the first and second electrode films 531 and 533. Alternatively, the thermistor film may have at least two rectangular bands connected in parallel between the first and second electrode films 531 and 533.

The electrode film 530 acts as an electrode for applying a voltage to the thermistor film 520 and includes the first and second electrode films 531 and 533. The first and second electrode films 531 and 533 overlie the substrate 510 and are disposed on either side of the thermistor film 520 so as to face each other. As shown in FIG. 15A, the first and second electrode films 531 and 533 may be formed so as to cover a portion of a top surface of the thermistor film 520.

Referring to FIG. 15B, the three-terminal thermistor 500a includes a substrate 510, a thermistor film 520, an electrode film 530, and a heat dissipating film 540. Unlike the two-terminal thermistor 500 of FIG. 15A, the thermistor 500a according to the present embodiment further includes the heat dissipating film 540 disposed on a bottom surface of the substrate 510. The heat dissipating film 540 dissipates heat away from the thermistor 500a and is formed of a metal having high thermal conductivity. By dissipating heat through the heat dissipating film 540, it is possible to prevent a malfunction caused by an increase in internal temperature.

The thermistor 500 and 500a each may further include a buffer layer (not shown) that is formed on the substrate 510 and mitigates a lattice mismatch between the substrate 510 and the thermistor film 520. The thermistor 500 and 500a each may further include an insulating layer (not shown) that is formed on the electrode film 530 and the thermistor film 520 and protects the thermistor film 520.

Figure 16:
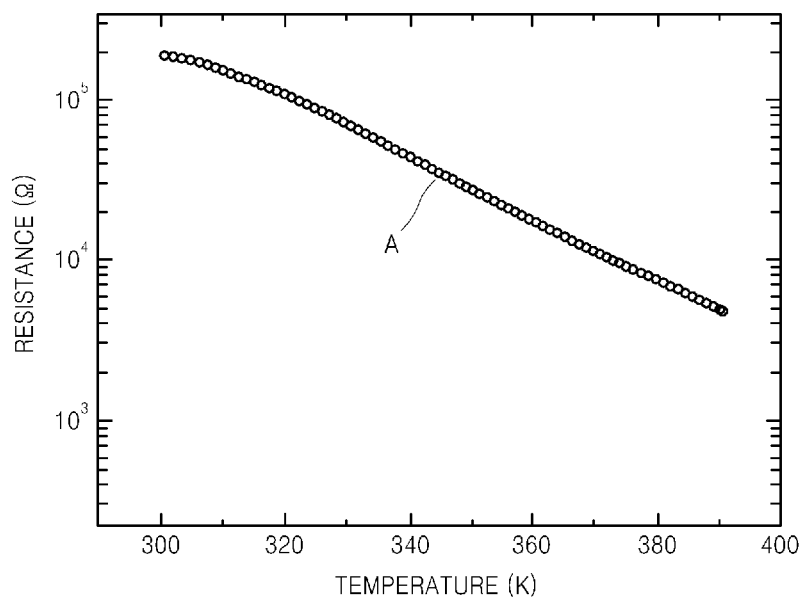
FIG. 16 is a graph of resistance against temperature for a thermistor.

FIG. 16 is a graph of resistance against temperature for a thermistor. Referring to FIG. 16, in the resistance-temperature graph A, resistance is exponentially decreased with increasing temperature. A thermistor in which resistance is inversely proportional to the temperature and decreases with an increase in temperature is called a NTC thermistor.

A NTC thermistor film may be formed of Berylium (Be)-doped GaAs, but is not limited thereto and may be formed of any other material having a NTC. For example, a pn junction diode or a pn junction between a base and emitter of a transistor may be used as a thermistor.

Variable gate FETs including a gate control device according to embodiments of the present invention are high-speed, high-power, low-emission switching elements and can be used in switching devices such as a radio frequency (RF) signal amplifier, a DC-to-DC (DC-DC) switching device, a switching device for power supply, a switching device for high-speed signal processing in a microprocessor, a light-emitting diode (LED) control switching device, switching devices for controlling the power of electronic appliances and apparatuses, charging a lithium (Li) ion battery, controlling pixels in a display, controlling memory cells, and amplifying acoustic and audio signals in an acoustic apparatus, a photo relay, and an optical switch. Furthermore, the variable gate FETs can be usefully employed for a wide variety of electrical and electronic apparatus including such switching devices, such as mobile phones, notebook and other computers, and memories.

Figure 17:
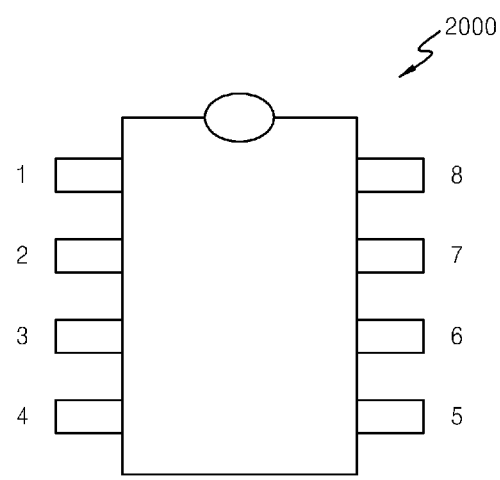
FIG. 17 is (a plan view of a variable gate FET encapsulated in one package according to an embodiment of the present invention.

FIG. 17 is a plan view of variable gate FETs packaged into one chip according to an embodiment of the present invention.

Referring to FIG. 17, the variable gate FETs 1000 or 1000a in the electrical and electronic apparatus of FIGS. 4, 5, 13, and 14, i.e., the FET 100 and the gate control device 200 or 500, may be encapsulated into a single chip package 2000. Within the single chip package 2000, the gate control device 200 or 500 may be disposed in a part of the FET 100 at which heat can be readily generated.

Pins 1 through 8 protruding out the single chip package 2000 may be used to connect to terminals of devices that are connected to the variable gate FET 1000 or 1000a. The number and arrangement structure of the pins 1 through 8 may vary depending on a particular application.

Figure 18A:
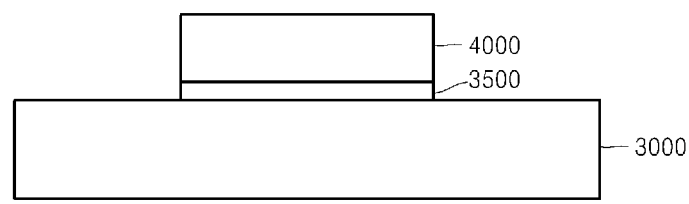
FIGS. 18A and 18B are respectively a cross-sectional view and a plan view of a variable gate FET according to an embodiment of the present invention, having a gate control device and a FET encapsulated in separate packages and assembled together.
Figure 18B:
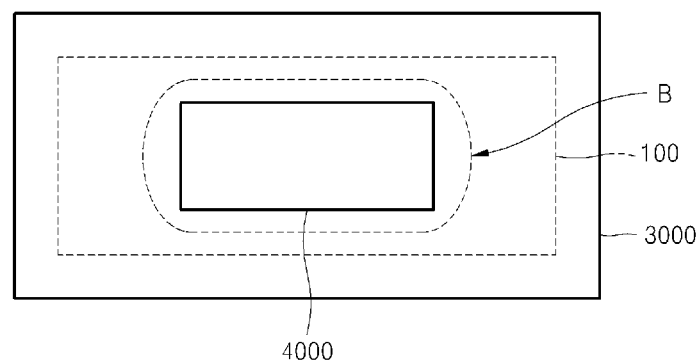

FIGS. 18A and 18B are respectively a cross-sectional view and a plan view of a variable gate FET according to an embodiment of the present invention, having a gate control device and a FET encapsulated in separate packages and assembled together. Referring to FIG. 18A, unlike the single chip package 2000 of FIG. 17, the variable gate FET 1000 or 1000a according to the present embodiment has the FET 100 and the gate control device 200 or 500 packaged separately and assembled together.

A second package 4000 encapsulating the gate control device 200 or 500 therein is assembled onto a first package 3000 encapsulating the FET 100 therein through a heat transfer medium 3500. The heat transfer medium 3500 may be formed of a highly thermally conductive material that can effectively transfer heat generated in the FET 100 to the gate control device 200 or 500. Furthermore, the second package 4000 can be assembled onto a portion of the first package 3000 where a large amount of heat is generated in order to enhance the performance of the gate control device 200 or 500.

Referring to FIG. 18B, the FET 100 is disposed within the first package 3000 and the second package 4000 overlies a portion B indicated by an elliptical dotted line, where a large amount of heat is generated. Although not shown in the plan view of FIG. 18B, the heat transfer medium 3500 may be disposed between the first and second packages 3000 and 4000.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A variable gate field effect transistor (FET) comprising:
   a FET; and
   a gate control device that is attached to a surface or a heat-generating portion of the FET and is connected to a gate terminal of the FET so as to vary a voltage of the gate terminal,
   wherein a channel current between a source and a drain of the FET is controlled by the gate control device that varies the voltage of the gate terminal when a temperature of the FET increases above a predetermined temperature.

2. The variable gate FET of claim 1, wherein the gate control device includes a Metal-Insulator Transition (MIT) device generating an abrupt MIT at a critical temperature.

3. The variable gate FET of claim 2, wherein the MIT device comprises a MIT film generating an abrupt MIT at the critical temperature and two electrode films contacting the MIT film, and
   wherein the MIT device has a stack type structure in which at least two electrode films are stacked with the MIT film interposed therebetween or has a horizontal type structure in which the at least two electrode films are disposed on either side of the MIT film.

4. The variable gate FET of claim 2, wherein the MIT device comprises a MIT film generating an abrupt MIT at the critical temperature and two electrode films contacting the MIT film, and
   wherein a first electrode film that is one of the two electrode films is connected to the gate terminal while a second electrode film that is the other of the two electrode films is connected to one of a control voltage source and ground.

5. The variable gate FET of claim 4, wherein when the temperature of the FET increases at or above the critical temperature, the MIT film transits from an insulator to a metal and one of a voltage from the control voltage source and a ground voltage is applied to the gate terminal.

6. The variable gate FET of claim 4, wherein the FET has a drain terminal connected to a driving voltage source, a source terminal connected to a driving device, and the gate terminal connected in common to a gate voltage source and the MIT device.

7. The variable gate FET of claim 2, wherein the MIT device comprises a MIT film generating an abrupt MIT at the critical temperature and two electrode films contacting the MIT film, and wherein the MIT film is formed of $VO_2$.

8. The variable gate FET of claim 1, wherein the gate control device includes a thermistor whose resistance decreases with an increase in temperature.

9. The variable gate FET of claim 8, wherein the thermistor has two terminals, one of which is connected to the gate terminal and the other terminal is connected to one of a control voltage source and ground.

10. The variable gate FET of claim 1, wherein the FET is a N-type or P-type, and wherein the FET may include one of an Insulated Gate Bipolar Transistor (IGBT) and a Metal Oxide Semiconductor (MOS) transistor.

11. The variable gate FET of claim 1, wherein the FET and the gate control device are packaged into one chip.

12. The variable gate FET of claim 1, further comprising a heat transfer medium transferring heat generated in the FET, wherein the FET and the gate control device are packaged separately and assembled together so as to transfer heat through the heat transfer medium.

13. An electrical and electronic apparatus comprising:
a driving device; and
at least one variable gate FET of claim 1 for controlling current that is supplied to the driving device.

14. The apparatus of claim 13, wherein the gate control device includes a MIT device generating an abrupt MIT at a critical temperature.

15. The apparatus of claim 14, wherein the gate control device comprises a MIT film in which an abrupt MIT is generated at the critical temperature and two electrode films contacting the MIT film, and wherein a first electrode film that is one of the two electrode films is connected to the gate terminal while a second electrode film that is the other of the two electrode films is connected to one of a control voltage source and ground.

16. The apparatus of claim 15, wherein the FET has a drain terminal connected to a driving voltage source, a source terminal connected to the driving device, and the gate terminal connected in common to a gate voltage source and the MIT device.

17. The apparatus of claim 13, wherein the gate control device includes a thermistor whose resistance decreases with an increase in temperature.

18. The apparatus of claim 17, wherein the thermistor has two terminals, one of which is connected to the gate terminal and the other terminal is connected to one of a control voltage source and ground.

19. The apparatus of claim 13, wherein a plurality of variable gate FETs are arranged in an array to form a FET array device, each of which is connected to the gate control device.

20. The apparatus of claim 13, including at least one of a radio frequency (RF) signal amplifier, a DC-to-DC (DC-DC) switching device, a switching device for power supply, a switching device for high-speed signal processing in a microprocessor, a light emitting device (LED) control switching device, switching devices for controlling the power of electronic appliances and apparatuses, charging a lithium (Li) ion battery, controlling pixels in a display, controlling memory cells, and amplifying acoustic and audio signals in an acoustic apparatus, a photo relay, and an optical switch, in which the variable gate FET is used.

* * * * *